US010804021B2

(12) United States Patent
Jeong

(10) Patent No.: US 10,804,021 B2
(45) **Date of Patent: *Oct. 13, 2020**

(54) CHIP ELECTRONIC COMPONENT AND METHOD OF MANUFACTURING THE SAME

(71) Applicant: SAMSUNG ELECTRO-MECHANICS CO., LTD., Suwon-si, Gyeonggi-do (KR)

(72) Inventor: Dong Jin Jeong, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 55 days.

This patent is subject to a terminal disclaimer.

(21) Appl. No.: 16/381,675

(22) Filed: Apr. 11, 2019

(65) Prior Publication Data

US 2019/0237232 A1 Aug. 1, 2019

Related U.S. Application Data

(63) Continuation of application No. 14/676,758, filed on Apr. 1, 2015, now Pat. No. 10,297,377.

(30) Foreign Application Priority Data

Oct. 16, 2014 (KR) ........................ 10-2014-0140079

(51) Int. Cl.
*H01F 5/00* (2006.01)
*H01F 17/00* (2006.01)
(Continued)

(52) U.S. Cl.
CPC ......... *H01F 17/0013* (2013.01); *H01F 17/06* (2013.01); *H01F 27/292* (2013.01); *H01F 2017/048* (2013.01)

(58) Field of Classification Search
CPC ............... H01F 41/041; H01F 17/0006; H01F 17/0013; H01F 27/2804; H01F 2027/2809; H01L 2924/1206; H01L 2924/30107
(Continued)

(56) References Cited

U.S. PATENT DOCUMENTS 5,746,868 A 5/1998 Abe
5,779,873 A 7/1998 Law et al.
(Continued)

FOREIGN PATENT DOCUMENTS

CN 1574128 A 2/2005
CN 1717964 A 1/2006
(Continued)

OTHER PUBLICATIONS

U.S. Notice of Allowance dated Jan. 9, 2019 issued in U.S. Appl. No. 14/676,758.
(Continued)

*Primary Examiner* — Elvin G Enad
*Assistant Examiner* — Joselito Baisa
(74) *Attorney, Agent, or Firm* — Morgan, Lewis & Bockius LLP

(57) ABSTRACT

A chip electronic component includes a magnetic body including an insulating substrate, and an internal coil part formed on at least one surface of the insulating substrate. The internal coil part includes first coil patterns formed on the insulating substrate, second coil patterns disposed on the first coil patterns, and third coil patterns disposed on the second coil patterns, and interface parts distinguished from the first to third coil patterns are disposed on at least one of interfaces between the first and second coil patterns and interfaces between the second and third coil patterns.

8 Claims, 5 Drawing Sheets

'A'

(51) Int. Cl.
*H01F 17/06* (2006.01)
*H01F 27/29* (2006.01)
*H01F 17/04* (2006.01)

(58) Field of Classification Search
USPC .......................................................... 336/200
See application file for complete search history.

(56) References Cited

U.S. PATENT DOCUMENTS 6,375,063 B1 * 4/2002 Basra .................... G11B 5/3103 228/215
6,378,199 B1 4/2002 Yoshimuma et al.
6,600,404 B1 7/2003 Kajino
6,902,824 B2 6/2005 Yamamoto et al.
7,126,419 B2 10/2006 Miyasita
7,176,773 B2 2/2007 Shoji
7,188,412 B2 3/2007 Yazaki et al.
7,345,563 B2 * 3/2008 Pavier ................. H01F 17/0006 336/200
7,854,829 B2 * 12/2010 Kamijima .............. C25D 5/022 205/118
7,870,665 B2 1/2011 Nomura et al.
8,080,875 B2 12/2011 Imanaka
8,500,985 B2 * 8/2013 Mayer ....................... C25F 5/00 205/112
8,604,604 B2 12/2013 Rudin
8,742,539 B2 * 6/2014 Weyers ................... H01L 28/10 257/531
8,841,210 B1 * 9/2014 Kuraguchi ........ H01L 21/28079 438/622
2001/0016252 A1 8/2001 Nagamoto et al.
2002/0079133 A1 6/2002 Yamamoto et al.
2002/0079135 A1 6/2002 Yazaki et al.
2004/0008305 A1 1/2004 Payne et al.
2004/0066266 A1 4/2004 Kusano
2004/0066633 A1 4/2004 Yazaki et al.
2004/0164835 A1 8/2004 Shoji
2006/0118905 A1 6/2006 Himori et al.
2008/0149490 A1 * 6/2008 Bonhote .................. C25D 5/02 205/183
2009/0243781 A1 10/2009 Nomura et al.
2010/0018612 A1 1/2010 Tokuda et al.
2010/0051334 A1 * 3/2010 Ho ....................... H05K 1/0237 174/257
2010/0084263 A1 * 4/2010 Bonhote .................. G11B 5/17 204/192.35
2010/0304953 A1 12/2010 Liu et al.
2011/0174418 A1 7/2011 Maki et al.
2012/0025674 A1 2/2012 Yoshida et al.
2013/0249664 A1 9/2013 Tonoyama et al.
2013/0300527 A1 * 11/2013 Kim ...................... H01F 41/046 336/83
2015/0035640 A1 2/2015 Wang et al.

FOREIGN PATENT DOCUMENTS

| | | | |
|---|---|---|---|
| CN | 1258777 | C | 6/2006 |
| CN | 103366920 | A | 10/2013 |
| CN | 103695972 | A | 4/2014 |
| EP | 0785296 | A1 | 7/1997 |
| JP | 2001-267166 | A | 9/2001 |
| JP | 2001-313447 | A | 11/2001 |
| JP | 2002-359470 | A | 12/2002 |
| JP | 2004-253684 | A | 9/2004 |
| JP | 2006-278479 | A | 10/2006 |
| JP | 2006-310705 | A | 11/2006 |
| JP | 2013-201375 | A | 10/2013 |
| JP | 2014-080674 | A | 5/2014 |

OTHER PUBLICATIONS

Final Office Action dated Jul. 2, 2018 issued in U.S. Appl. No. 14/676,758.
Non-final Office Action dated Jan. 2, 2018 issued in U.S. Appl. No. 14/676,758.
Final Office Action dated Aug. 25, 2017 issued in U.S. Appl. No. 14/676,758.
Korean Office Action dated May 22, 2017 issued in Korean Patent Application No. 10-2014-014079 (with English translation).
Chinese Office Action dated Mar. 24, 2017 issued in Chinese Patent Application No. 201510535961.7 (with English translation).
Non-final Office Action dated Mar. 1, 2017 issued in U.S. Appl. No. 14/676,758.
Office Action issued in corresponding Chinese Application No. 201810371180.2 dated Oct. 9, 2019, with English translation.

* cited by examiner

CHIP ELECTRONIC COMPONENT AND METHOD OF MANUFACTURING THE SAME

CROSS-REFERENCE TO RELATED APPLICATION

This application is a continuation patent application of U.S. patent application Ser. No. 14/676,758, filed on Apr. 1, 2015, which claims the priority and benefit of Korean Patent Application No. 10-2014-0140079 filed on Oct. 16, 2014, with the Korean Intellectual Property Office, the disclosure of which is incorporated herein by reference.

BACKGROUND

The present disclosure relates to a chip electronic component and a method of manufacturing the same.

An inductor, a chip electronic component, is a representative passive element, configuring an electronic circuit together with a resistor and a capacitor to remove noise therefrom. Such an inductor may be combined with a capacitor using electromagnetic properties to configure a resonance circuit amplifying a signal in a specific frequency band, a filter circuit, or the like.

As the miniaturization and thinning of information technology (IT) devices such as communications devices, display devices, or the like, has accelerated, research into a technology for miniaturizing and thinning various elements such as inductors, capacitors, transistors, and the like, used in such thinned and miniaturized IT devices has been continuously undertaken. Therefore, inductors have been rapidly replaced by small-sized, highly dense chips capable of being automatically surface-mounted, as well as thin film type inductors in which mixtures of magnetic powders and resins are formed as coil patterns on upper and lower surfaces of a thin film insulating substrate by plating have been developed.

Direct current (DC) resistance (Rdc), a main feature of such inductors, may be affected by an overall shape as well as a cross sectional shape of a coil. Therefore, DC resistance (Rdc) needs to be lowered through coil-shape design.

RELATED ART DOCUMENT (Patent Document 1) Japanese Patent Laid-Open Publication No. 2006-278479

SUMMARY

An aspect of the present disclosure may provide a chip electronic component having a low direct current (DC) resistance (Rdc), and a method of manufacturing the same.

According to an aspect of the present disclosure, a chip electronic component in which an internal coil part includes first coil patterns, second coil patterns disposed on the first coil patterns, and third coil patterns disposed on the second coil patterns to increase height to width ratios of coils while preventing occurrence of short-circuits between the coils, thereby implementing an internal coil structure having a high aspect ratio (AR), and a method of manufacturing the same may be provided.

Interface parts distinguished from the first to third coil patterns may be disposed on at least one of interfaces between the first and second coil patterns and interfaces between the second and third coil patterns.

According to an exemplary embodiment in the present disclosure, a chip electronic component in which thicknesses of the interface parts are less than 1.5 μm to suppress an increase in DC resistance (Rdc) may be provided.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
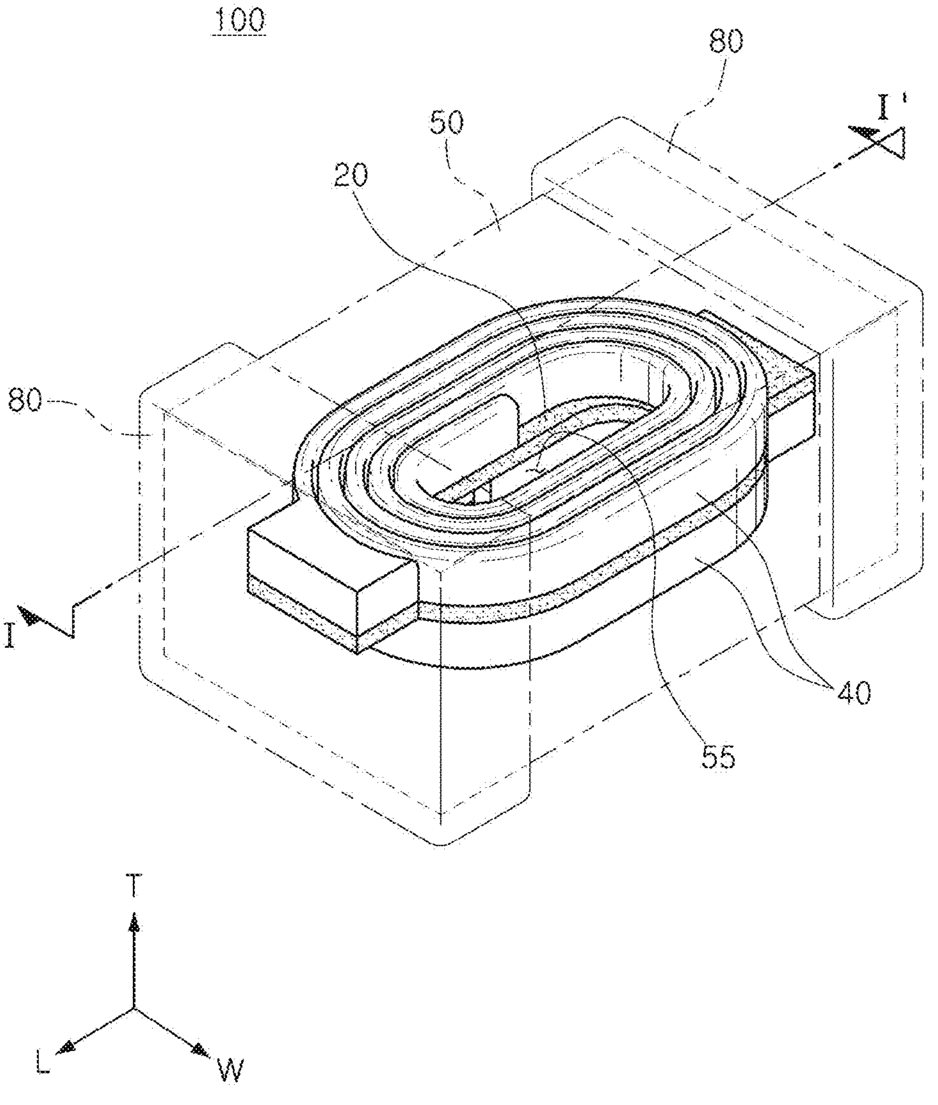
FIG. 1 is a schematic perspective view showing a chip electronic component according to an exemplary embodiment in the present disclosure so that an internal coil part of the chip electronic component is viewed.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Chip Electronic Component

Hereinafter, a chip electronic component according to an exemplary embodiment in the present disclosure, particularly, a thin film type inductor will be described. However, the present disclosure is not limited thereto.

Figure 2:
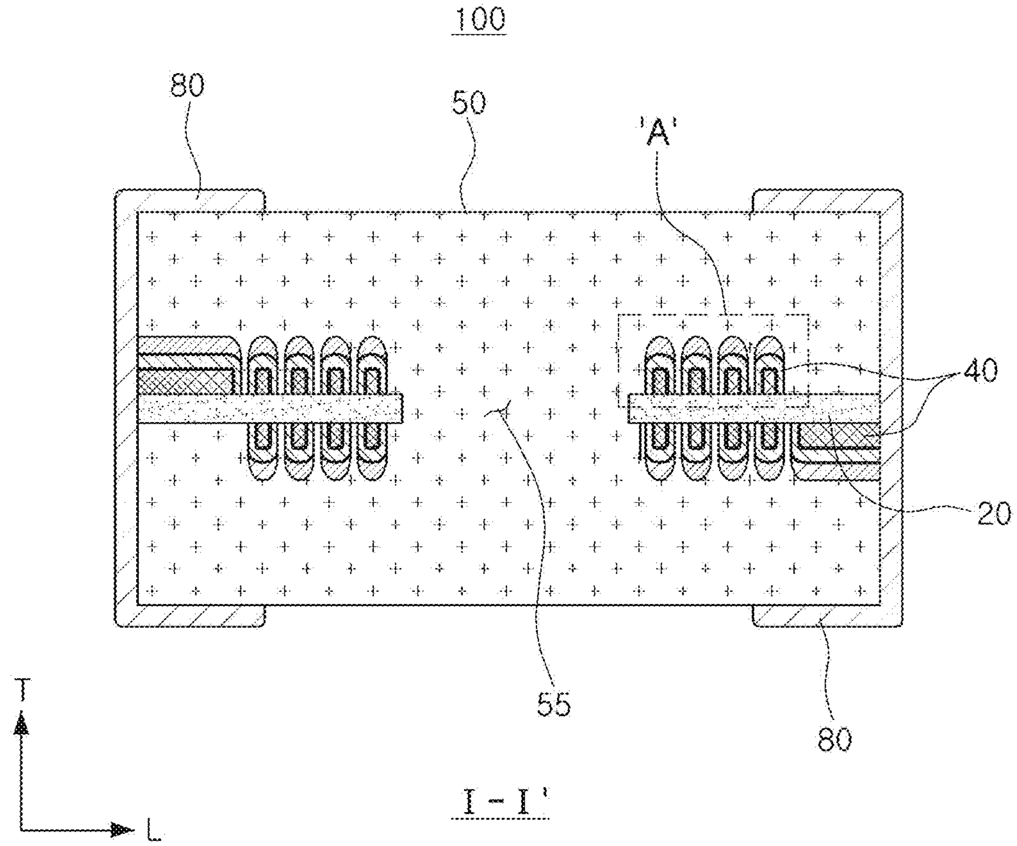
FIG. 2 is a cross-sectional view taken along line I-I' of FIG. 1.

FIG. 1 is a schematic perspective view showing a chip electronic component according to an exemplary embodiment in the present disclosure so that an internal coil part of the chip electronic component is viewed; and FIG. 2 is a cross-sectional view taken along line I-I' of FIG. 1.

Figure 3:
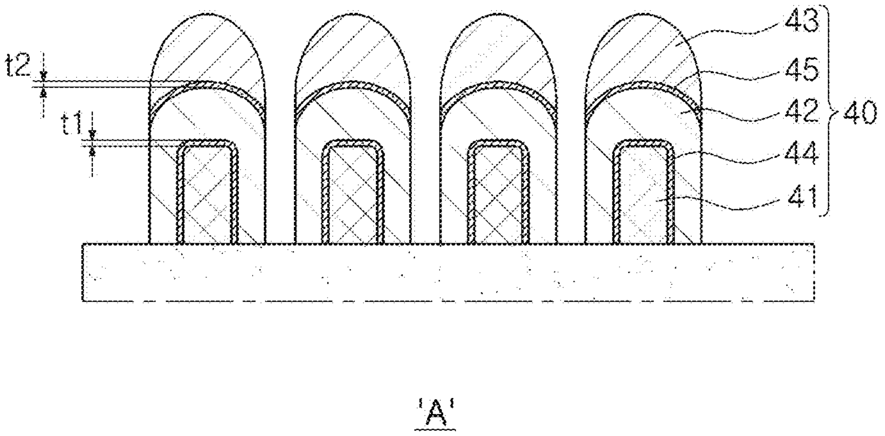
FIG. 3 is an enlarged schematic view of an example of part A of FIG. 2.

FIG. 3 is an enlarged schematic view of an example of part A of FIG. 2.

Referring to FIGS. 1 and 2, as an example of a chip electronic component, a chip inductor 100 used in a power line of a power supply circuit is disclosed. The chip electronic component may be appropriately applied as a chip bead, a chip filter, and the like, as well as the chip inductor.

The chip inductor 100 may include a magnetic body 50, an insulating substrate 20, internal coil parts 40, and external electrodes 80.

The magnetic body 50 may form an appearance of the chip inductor 100 and may be formed of any material that exhibits a magnetic property. For example, the magnetic body 50 may be formed by filling ferrite or a metal based soft magnetic material.

The ferrite may contain ferrite known in the art, such as Mn—Zn based ferrite, Ni—Zn based ferrite, Ni—Zn—Cu based ferrite, Mn—Mg based ferrite, Ba based ferrite, Li based ferrite, or the like.

The metal based soft magnetic material may be an alloy containing at least one selected from the group consisting of Fe, Si, Cr, Al, and Ni. For example, the metal based soft magnetic material may contain Fe—Si—B—Cr based amorphous metal particles, but is not limited thereto.

The metal based soft magnetic material may have a particle diameter of 0.1 to 20 μM and may be contained in a polymer such as an epoxy resin, polyimide, or the like, in a form in which it is dispersed on the polymer.

The magnetic body 50 may have a hexahedral shape. Directions of a hexahedron will be defined in order to clearly describe an exemplary embodiment in the present disclosure. L, W and T shown in FIG. 1 refer to a length direction, a width direction, and a thickness direction of the magnetic body 50, respectively. The magnetic body 50 may have a rectangular parallelepiped shape in which a dimension thereof in the length direction is larger than a dimension thereof in the width direction.

The insulating substrate 20 formed in the magnetic body 50 may be, for example, a polypropylene glycol (PPG) substrate, a ferrite substrate, a metal based soft magnetic substrate, or the like.

The insulating substrate 20 may have a hole formed in a central portion thereof so as to penetrate therethrough, wherein the hole may be filled with a magnetic material such as ferrite, a metal based soft magnetic material, or the like, to forma core part 55. The core part 55 filled with the magnetic material may be formed, thereby improving an inductance L.

The insulating substrate 20 may have the internal coil parts 40 formed on one surface and the other surface thereof opposing one surface thereof, respectively, wherein the internal coil parts 40 have coil shaped patterns, respectively.

The internal coil parts 40 may include coil patterns formed in a spiral shape, respectively, and the internal coil parts 40 formed on one surface and the other surface of the insulating substrate 20 may be electrically connected to each other through a via electrode (not shown) formed in the insulating substrate 20.

FIG. 3 is an enlarged schematic view of an example of part A of FIG. 2.

Referring to FIG. 3, the internal coil part 40 may include first coil patterns 41 formed on the insulating substrate 20 and second coil pattern 42 coating the first coil patterns 41.

According to an exemplary embodiment in the present disclosure, the internal coil part 40 may further include third coil patterns 43 disposed on the second coil patterns 42.

The first coil patterns 41 may be pattern plating layers formed by forming a patterned plating resist on the insulating substrate 20 and filling openings with conductive metals.

The second coil patterns 42 may be formed by performing electroplating and be isotropic plating layers having a shape in which they are grown in both of a width direction (W) and a height direction (T) of the coil.

The third coil patterns 43 may be formed by performing electroplating and be anisotropic plating layers having a shape in which they are grown in only the height direction (T) of the coil while being suppressed from being grown in the width direction (W) of the coil.

A current density, a concentration of plating solution, a plating speed, and the like, may be adjusted to form the second coil patterns 42 as the isotropic plating layers and form the third coil patterns 43 as the anisotropic plating layers.

As in an exemplary embodiment in the present disclosure, the first coil patterns 41, which are the pattern plating layers, are formed on the insulating substrate 20, the second coil patterns 42, which are the isotropic plating layers coating the first coil patterns 41, are formed, and the third coil patterns 43, which are the anisotropic plating layers, are formed on the second coil patterns 42 to prevent generation of short-circuits between the coils while promoting growth of the coils in the height direction, whereby the internal coil part 40 having a high aspect ratio (AR), for example, an aspect ratio (AR) (thickness/width) of 1.2 or more, may be implemented.

According to an exemplary embodiment in the present disclosure, first interface portions 44 distinguished from the first and second coil patterns 41 and 42 may be disposed on interfaces between the first and second coil patterns 41 and 42.

According to an exemplary embodiment in the present disclosure, the internal coil part 40 may further include third coil patterns 43 disposed on the second coil patterns 42, and second interface portions 45 distinguished from the second and third coil patterns 42 and 43 may be disposed on interfaces between the second and third coil patterns 42 and 43.

The first and second interface portions 44 and 45 may have crystal phases distinguished from those of the first to third coil patterns 41 to 43, and sizes of particles included in the first and second interface portions 44 and 45 may be smaller than those of particles included in the first to third coil patterns 41 to 43.

Figure 4:
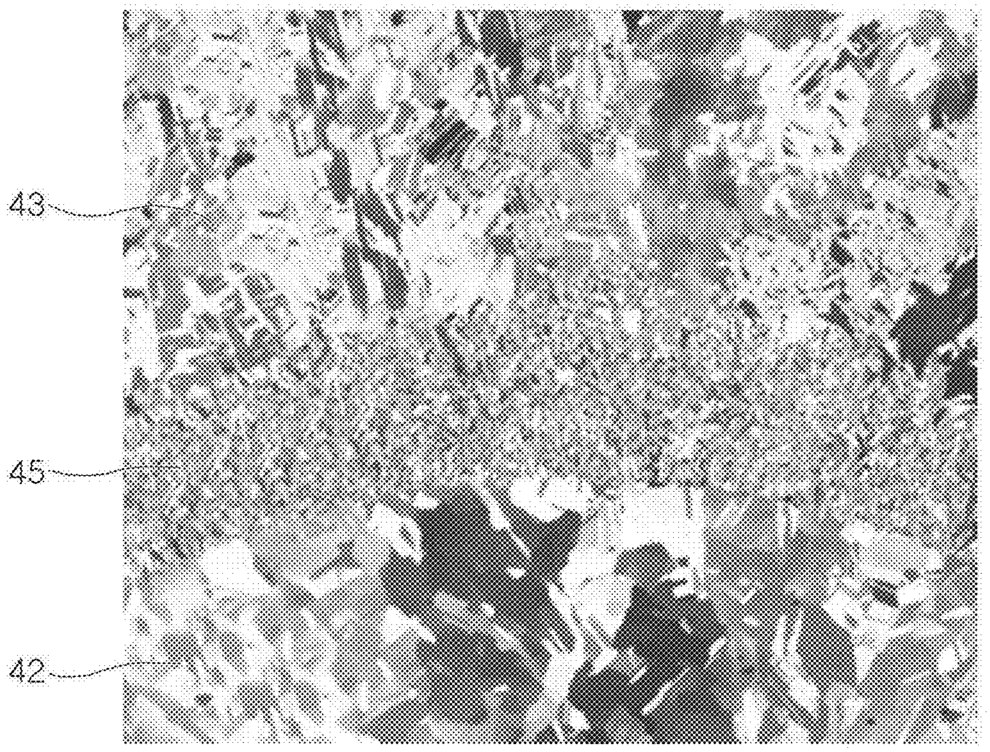
FIG. 4 is an enlarged photograph showing cross sections of a second coil pattern, a third coil pattern, and a second interface portion disposed between the second and third coil patterns according to an exemplary embodiment in the present disclosure.

FIG. 4 is an enlarged photograph showing cross sections of a second coil pattern 42, a third coil pattern 43, and a second interface portion 45 disposed between the second and third coil patterns according to an exemplary embodiment in the present disclosure.

As shown in FIG. 4, in a cross section, the second interface portion 45 may have a particle shape distinguished from those of the second and third coil patterns 42 and 43, and a particle size of the second interface portion 45 may be smaller than those of the second and third coil patterns 42 and 43.

The first interface portion 44 may be formed in a process of forming the second coil pattern 42 on the first coil pattern 41, and the second interface portion 45 may be formed in a process of forming the third coil pattern 43 on the second coil pattern 42.

According to an exemplary embodiment in the present disclosure, a thickness t1 of the first interface portion and a thickness t2 of the second interface portion may be less than 1.5 μm.

In the case in which the thicknesses of the first and second interface portions 44 and 45 are 1.5 μm or more, a direct current (DC) resistance (Rdc) value may be increased due to hindrance of movement of a current in the internal coil part.

In addition, particle sizes of the interface parts may be smaller in the case in which the thicknesses of the first and second interface portions 44 and 45 are 1.5 μm or more than in the case in which the thicknesses of the first and second interface portions 44 and 45 are less 1.5 μm.

The internal coil part 40 may be formed of a metal having excellent electrical conductivity, for example, silver (Ag), palladium (Pd), aluminum (Al), nickel (Ni), titanium (Ti), gold (Au), copper (Cu), platinum (Pt), or an alloy thereof, etc.

The first coil patterns 41, the second coil patterns 42, and the third coil patterns 43 may be formed of the same metal, most preferably, copper (Cu).

The internal coil part 40 may be coated with an insulating layer (not shown).

The insulating layer (not shown) may be formed by a method well-known in the art such as a screen printing method, an exposure and development method of a photoresist (PR), a spray applying method, or the like. The internal coil part 40 may be coated with the insulating layer, such that it may not directly contact a magnetic material forming the magnetic body 50.

One end portion of the internal coil part 40 formed on one surface of the insulating substrate 20 may be exposed to at least one of both side surfaces of the magnetic body 50 in the length direction thereof, and one end portion of the internal coil part 40 formed on the other surface of the insulating substrate 20 may be exposed to the other side surface of the magnetic body 50 in the length direction thereof.

The external electrodes 80 may be formed on both end surfaces of the magnetic body 50 in the length direction thereof, respectively, so as to be connected to the internal coil parts 40 exposed to both side surfaces of the magnetic body 50 in the length direction thereof, respectively. The external electrodes 80 may be extended to both end surfaces of the magnetic body 50 in the thickness direction thereof and/or both end surfaces of the magnetic body 50 in the width direction thereof.

The external electrodes 80 may be formed of a metal having excellent electrical conductivity, for example, nickel (Ni), copper (Cu), tin (Sn), silver (Ag), or an alloy thereof, etc.

Method of Manufacturing Chip Electronic Component

Figure 5:
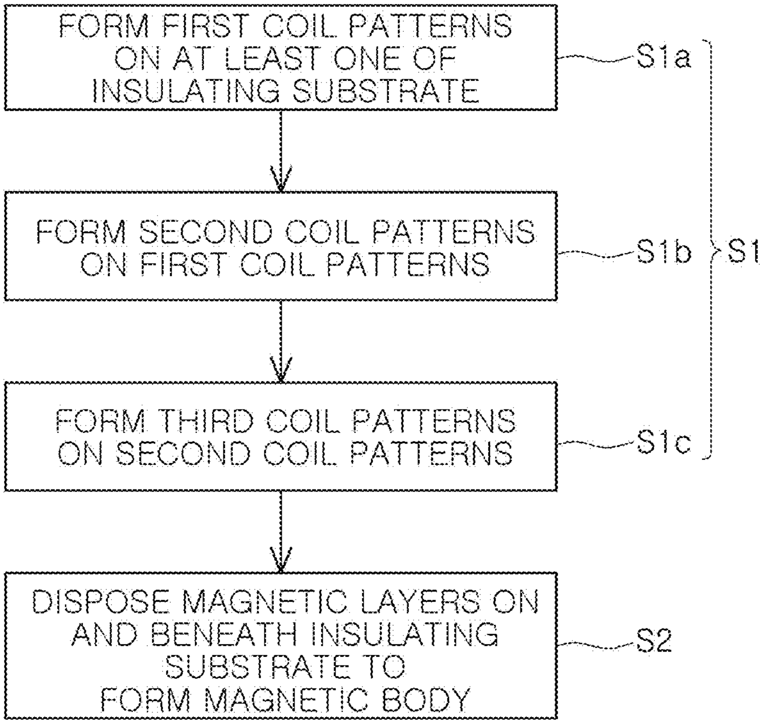
FIG. 5 is a flow chart showing a method of manufacturing a chip electronic component according to an exemplary embodiment in the present disclosure.

FIG. 5 is a flowchart showing a method of manufacturing a chip electronic component according to an exemplary embodiment in the present disclosure; and FIGS. 6 through 10 are views sequentially showing a method of manufacturing a chip electronic component according to an exemplary embodiment in the present disclosure.

Referring to FIG. 5, the method of manufacturing a chip electronic component according to an exemplary embodiment in the present disclosure may include forming the internal coil part on at least one surface of the insulating substrate (S1); and disposing the magnetic layers on and beneath the insulating substrate to form the magnetic body (S2).

The forming (S1) of the internal coil part may include forming the first coil patterns on at least one of the insulating substrate (S1*a*), forming the second coil patterns on the first coil patterns (S1*b*), and forming the third coil patterns on the second coil patterns (S1*c*).

The insulating substrate 20 is not particularly limited, but may be, for example, a polypropylene glycol (PPG) substrate, a ferrite substrate, a metal based soft magnetic substrate, or the like, and may have a thickness of 40 to 100 μM.

Figure 6:
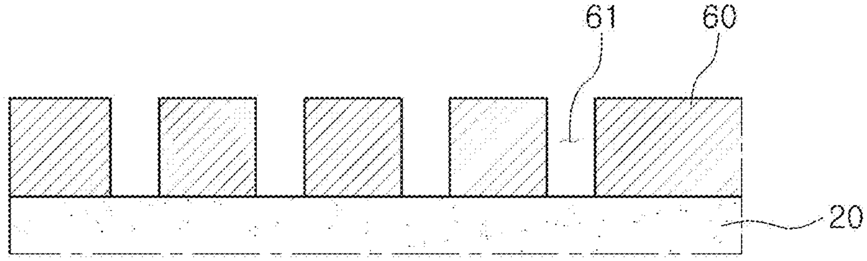
FIGS. 6 through 10 are views sequentially showing a method of manufacturing a chip electronic component according to an exemplary embodiment in the present disclosure.

As a method of forming the internal coil part 40, referring to FIG. 6, a plating resist 60 having openings 61 for forming the first coil patterns may be formed on the insulating substrate 20.

The plating resist 60, which is a general photosensitive resist film, may be a dry film resist, or the like, but is not particularly limited thereto.

Figure 7:
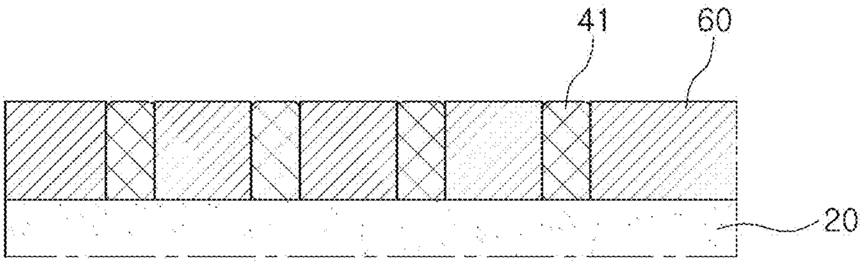

Referring to FIG. 7, a process such as an electroplating process, or the like, may be performed on the openings 61 for forming the first coil patterns to fill the openings 61 with electrically conductive metals, thereby forming the first coil patterns 41.

The first coil pattern 41 may be formed of a metal having excellent electrical conductivity, for example, silver (Ag), palladium (Pd), aluminum (Al), nickel (Ni), titanium (Ti), gold (Au), copper (Cu), platinum (Pt), or an alloy thereof, etc.

Figure 8:
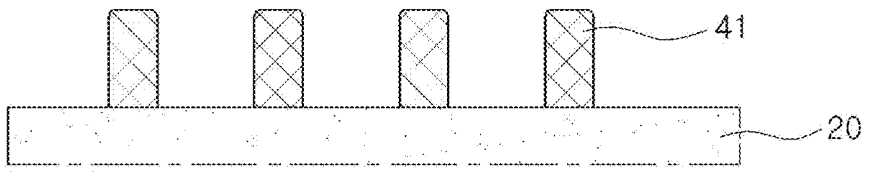

Referring to FIG. 8, the plating resist 60 may be removed by a process such as a chemical etching process, or the like.

When the plating resist 60 is removed, the first coil patterns 41, which are the pattern plating layers, may remain on the insulating substrate 20.

Figure 9:
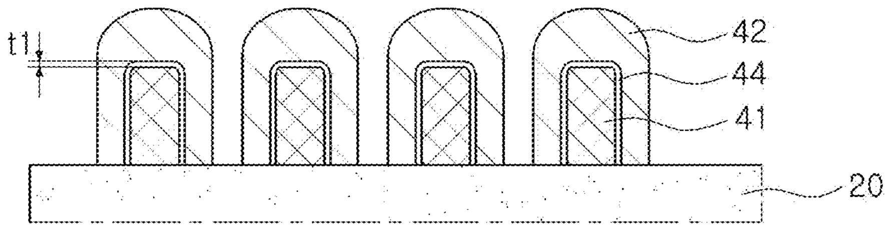

Referring to FIG. 9, electroplating may be performed on the first coil patterns 41 to form the second coil patterns 42 coating the first coil patterns 41.

At the time of performing the electroplating, a current density, a concentration of plating solution, a plating speed, and the like, may be adjusted to form the second coil patterns 42 as the isotropic plating layers having a shape in which they are grown in both of the width direction (W) and the height direction (T) of the coil.

In a process of forming the second coil patterns 42, the first interface portions 44 may be formed on the interfaces between the first and second coil patterns.

Figure 10:
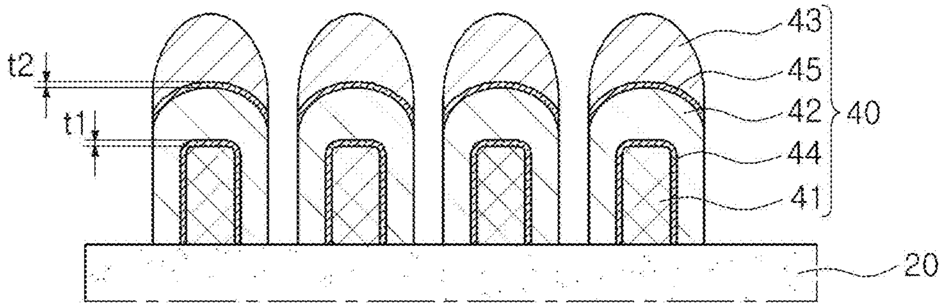

Referring to FIG. 10, electroplating may be performed on the second coil patterns 42 to form the third coil patterns 43.

At the time of performing the electroplating, a current density, a concentration of plating solution, a plating speed, and the like, may be adjusted to form the third coil patterns 43 as the anisotropic plating layers having a shape in which they are grown in only the height direction (T) of the coil while being suppressed from being grown in the width direction (W) of the coil.

In a process of forming the third coil patterns 43, the second interface portions 45 may be formed on the interfaces between the second and third coil patterns.

Thicknesses of the first and second interface portions may be less than 1.5 μm.

In the case in which the thickness of the interface part is less than 1.5 μm, an increase in a DC resistance (Rdc) value may be suppressed.

The second and third coil patterns 42 and 43 may be formed of a metal having excellent electrical conductivity, for example, silver (Ag), palladium (Pd), aluminum (Al), nickel (Ni), titanium (Ti), gold (Au), copper (Cu), platinum (Pt), or an alloy thereof, etc.

The first coil patterns 41, the second coil patterns 42, and the third coil patterns 43 may be formed of the same metal, preferably, copper (Cu).

The hole may be formed in a portion of the insulating substrate 20 and may be filled with a conductive material to form the via electrode (not shown), and the internal coil parts 40 formed on one surface and the other surface of the insulating substrate 20, respectively, may be electrically connected to each other through the via electrode.

Drilling, laser processing, sand blasting, punching, or the like, may be performed on a central portion of the insulating substrate 20 to form the hole penetrating through the insulating substrate.

After the internal coil parts 40 are formed, the insulating layer (not shown) coating the internal coil parts 40 may be formed. The insulating layer may be formed by a method well-known in the art such as a screen printing method, an exposure and development method of a photoresist (PR), a spray applying method, or the like, but is not limited thereto.

Next, magnetic layers may be disposed on upper and lower portions of the insulating substrate 20 having the internal coil parts 40 formed thereon, respectively, to form the magnetic body 50.

The magnetic layers may be stacked on both surfaces of the insulating substrate 20, respectively, and be compressed by a laminate method or an isostatic press method to form the magnetic body 50. Here, the hole may be filled with the magnetic material to form the core part 55.

Next, the external electrode 80 may be formed so as to be connected to the internal coil part 40 exposed to at least one end surface of the magnetic body 50.

The external electrode 80 may be formed of a paste containing a metal having excellent electrical conductivity, for example, a conductive paste containing nickel (Ni), copper (Cu), tin (Sn), or silver (Ag), or an alloy thereof, etc. The external electrode 80 may be formed by a dipping method, or the like, as well as a printing method depending on a shape thereof.

A description for features that are the same as those of the chip electronic component according to an exemplary embodiment in the present disclosure described above will be omitted in order to avoid an overlapped description.

Experimental Example

The following Table 1 shows a DC resistance (Rdc) value depending on thicknesses (t) of the first and second interface portions.

TABLE 1

| Sample | Thicknesses (μm) of First and Second interface portions | Rdc (μohm) |
|---|---|---|
| 1 | 0.05 | 1.7 |
| 2 | 0.1 | 1.71 |
| 3 | 0.5 | 1.7 |
| 4 | 1 | 1.7 |
| 5 | 1.5 | 1.95 |
| 6 | 2 | 2.0 |
| 7 | 2.5 | 2.1 |
| 8 | 3 | 2.2 |

It may be confirmed from Table 1 that in the case in which the thicknesses (t) of the first and second interface portions is 1.5 μm or more, the DC resistance (Rdc) value is increased.

As set forth above, in the chip electronic component according to an exemplary embodiment in the present disclosure, an internal coil structure having a high aspect ratio (AR) may be implemented by increasing height to width ratios of the coils while preventing generation of short-circuits between the coils.

In addition, according to exemplary embodiments of the present disclosure, the chip electronic component in which cross-sectional areas of the coils are increased and the increase in the DC resistance (Rdc) is suppressed, and the method of manufacturing the same may be provided.

While exemplary embodiments have been shown and described above, it will be apparent to those skilled in the art that modifications and variations could be made without departing from the scope of the present invention as defined by the appended claims.

What is claimed is:

1. A chip electronic component comprising:

a magnetic body including an insulating substrate; and an internal coil part disposed on at least one surface of the insulating substrate, wherein the internal coil part includes:

first coil patterns disposed on the insulating substrate, second coil patterns arranged to cover upper and side surfaces of the first coil patterns, third coil patterns disposed on upper surfaces of the second coil patterns, and interface parts, distinguished from the first to third coil patterns, disposed on one or more of interfaces between the first and second coil patterns and interfaces between the second and third coil patterns, wherein the first, second and third coil patterns are plated patterns, wherein the interface parts comprise:

first interface portions disposed on the interfaces between the first and second coil patterns, and second interface portions disposed on the interfaces between the second and third coil patterns, and wherein thicknesses of the interface parts are less than 1.5 μm.

2. The chip electronic component of claim 1, wherein the internal coil part has an aspect ratio (thickness/width) of 1.2 or more.

3. The chip electronic component of claim 1, wherein third coil patterns is formed in such a manner as not to contact the insulating substrate.

4. The chip electronic component of claim 1, wherein the second coil patterns have a shape in which the second coil patterns are grown in a width direction and a height direction.

5. The chip electronic component of claim 1, wherein the third coil patterns have a shape in which the third coil patterns are only grown in a height direction.

6. The chip electronic component of claim 1, wherein the second coil patterns are formed by isotropic plating, and the third coil patterns are formed by anisotropic plating.

7. The chip electronic component of claim 1, wherein the internal coil part contains one or more selected from the group consisting of silver (Ag), palladium (Pd), aluminum (Al), nickel (Ni), titanium (Ti), gold (Au), copper (Cu), and platinum (Pt).

8. The chip electronic component of claim 1, wherein the first to third coil patterns are formed of the same metal.

* * * * *